(12) United States Patent
Komine et al.

(10) Patent No.: US 8,467,247 B2
(45) Date of Patent: Jun. 18, 2013

(54) SEMICONDUCTOR MEMORY DEVICE

(75) Inventors: Yuji Komine, Hino (JP); Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 13/239,518

(22) Filed: Sep. 22, 2011

(65) Prior Publication Data

US 2012/0155179 A1 Jun. 21, 2012

(30) Foreign Application Priority Data

Dec. 17, 2010 (JP) ................. 2010-281385

(51) Int. Cl.
*G11C 11/34* (2006.01)
*G11C 16/04* (2006.01)
*G11C 7/00* (2006.01)
*G11C 5/14* (2006.01)

(52) U.S. Cl.
USPC ............ 365/185.17; 365/189.05; 365/189.09; 365/189.17; 365/191; 365/230.08; 365/185.05; 365/51; 365/63

(58) Field of Classification Search
USPC ............. 365/185.17, 189.05, 189.09, 189.17, 365/191, 230.08
See application file for complete search history.

(56) References Cited

U.S. PATENT DOCUMENTS

| 5,598,368 | A  | * | 1/1997 | Takahashi et al. ........ 365/185.01 |
| 5,856,951 | A  | * | 1/1999 | Arimoto et al. ................ 365/226 |
| 7,961,523 | B2 | * | 6/2011 | Lee et al. ................. 365/185.25 |

FOREIGN PATENT DOCUMENTS

JP          2007-35213         2/2007

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor memory device includes a memory cell array having memory cells, word lines connected to the memory cell array, a generation circuit configured to generate voltages required for operations of the memory cell array, selection circuits connected to the word lines, respectively, each of the selection circuits being configured to select a voltage applied to a word line from the voltages, and a transfer unit configured to transfer items of control data for selecting the voltage to the selection circuits, respectively. The transfer unit includes transfer circuits which shift an enable signal in sequence. The transfer circuits include latch circuits which hold the items of control data based on the shifted enable signal, respectively.

15 Claims, 7 Drawing Sheets

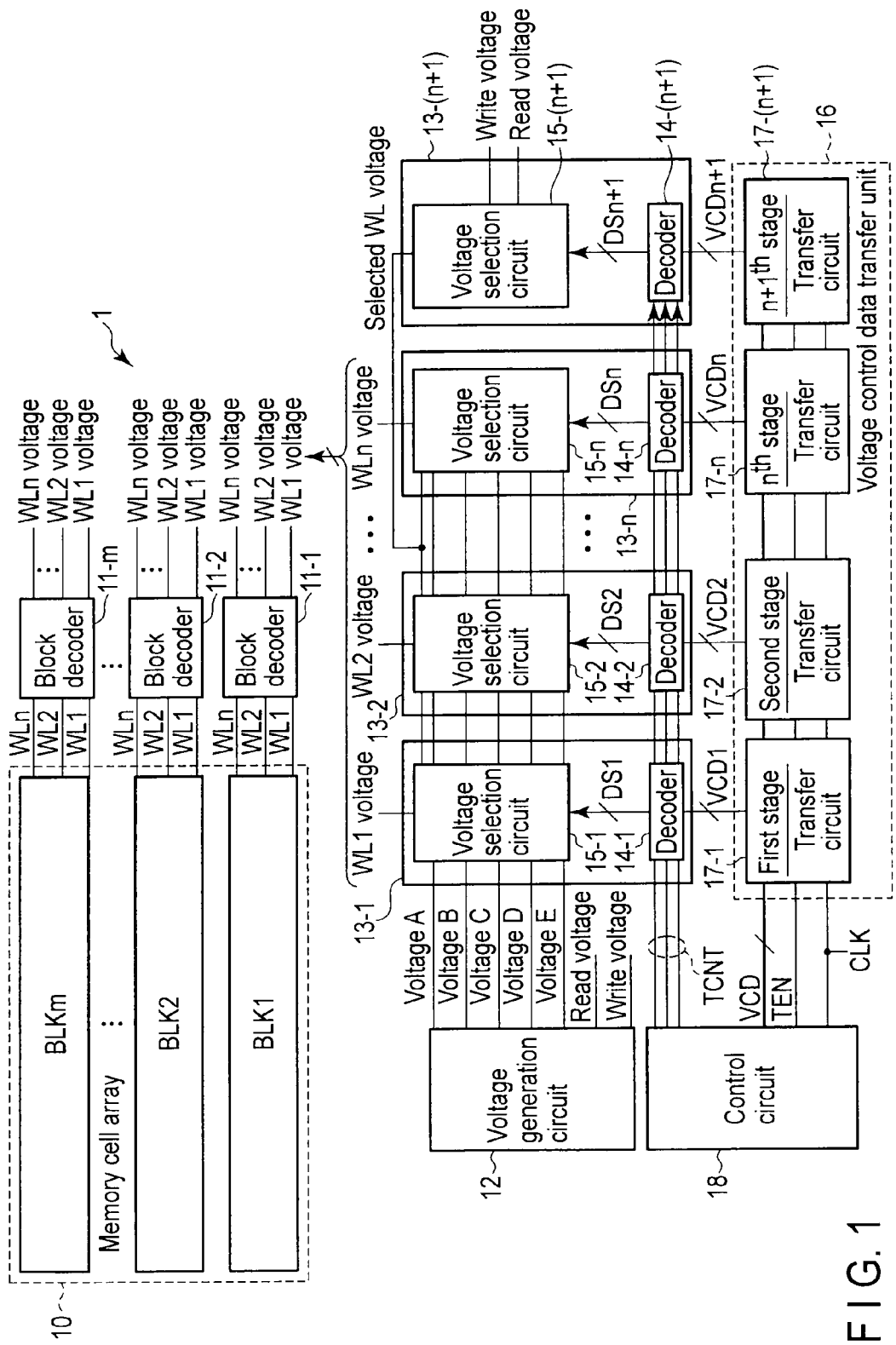
F I G. 1

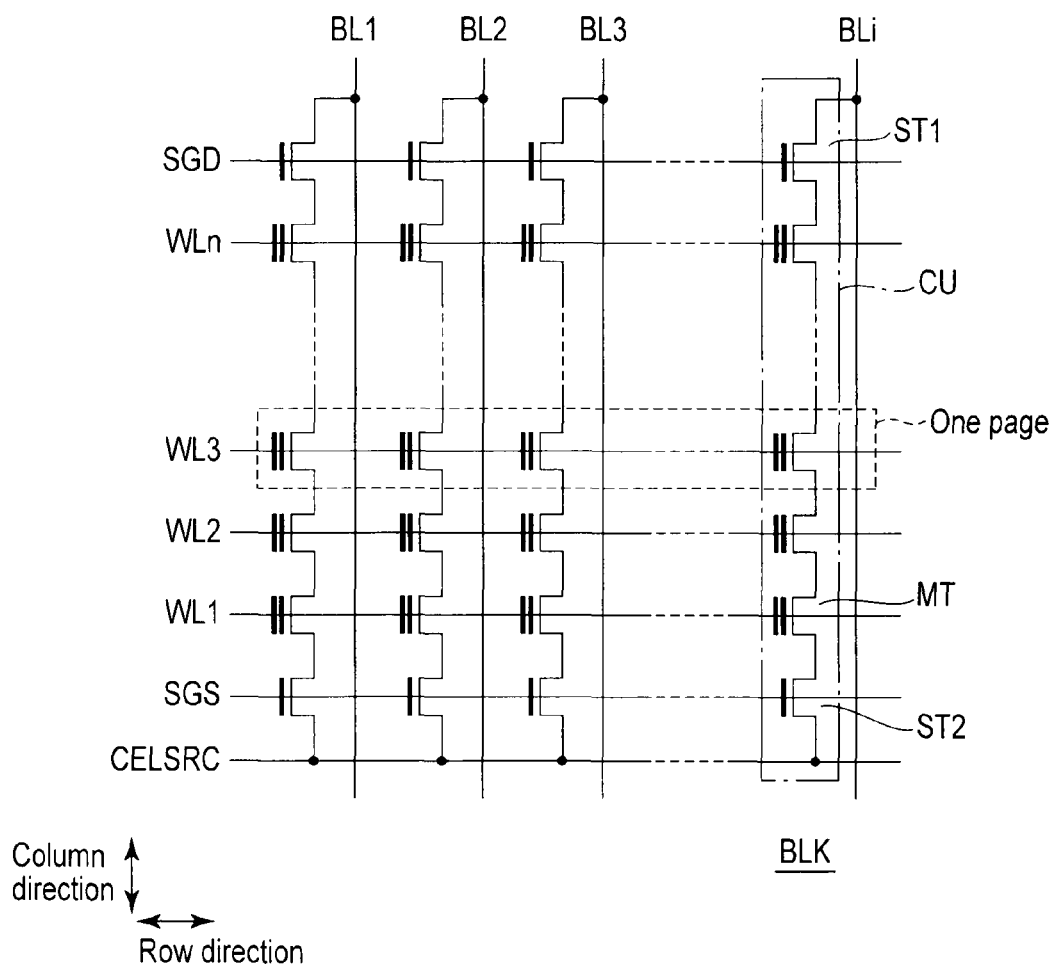
F I G. 2

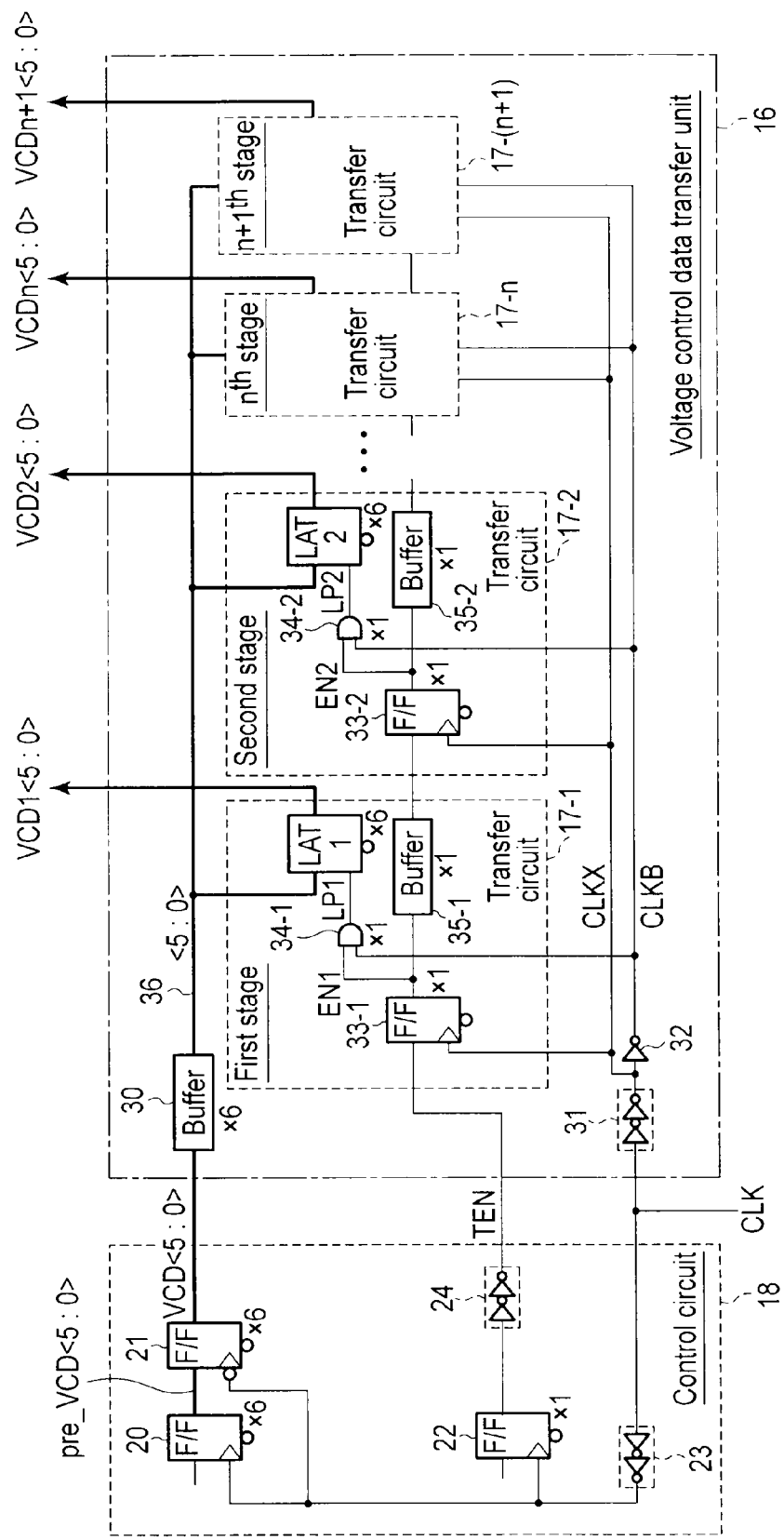
F I G. 3

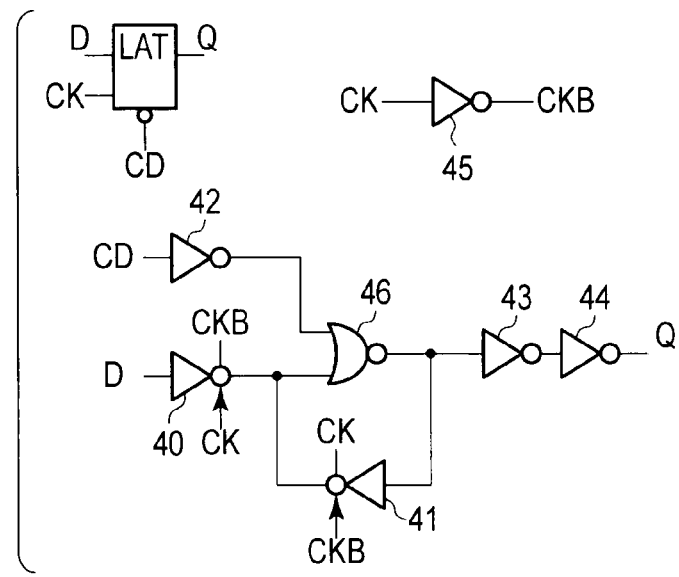
F I G. 4
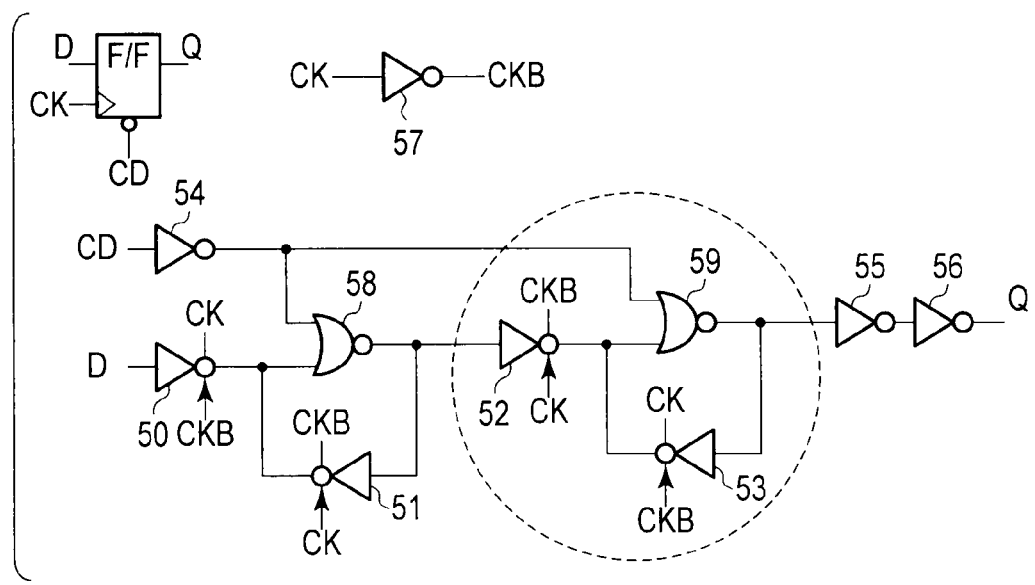
F I G. 5

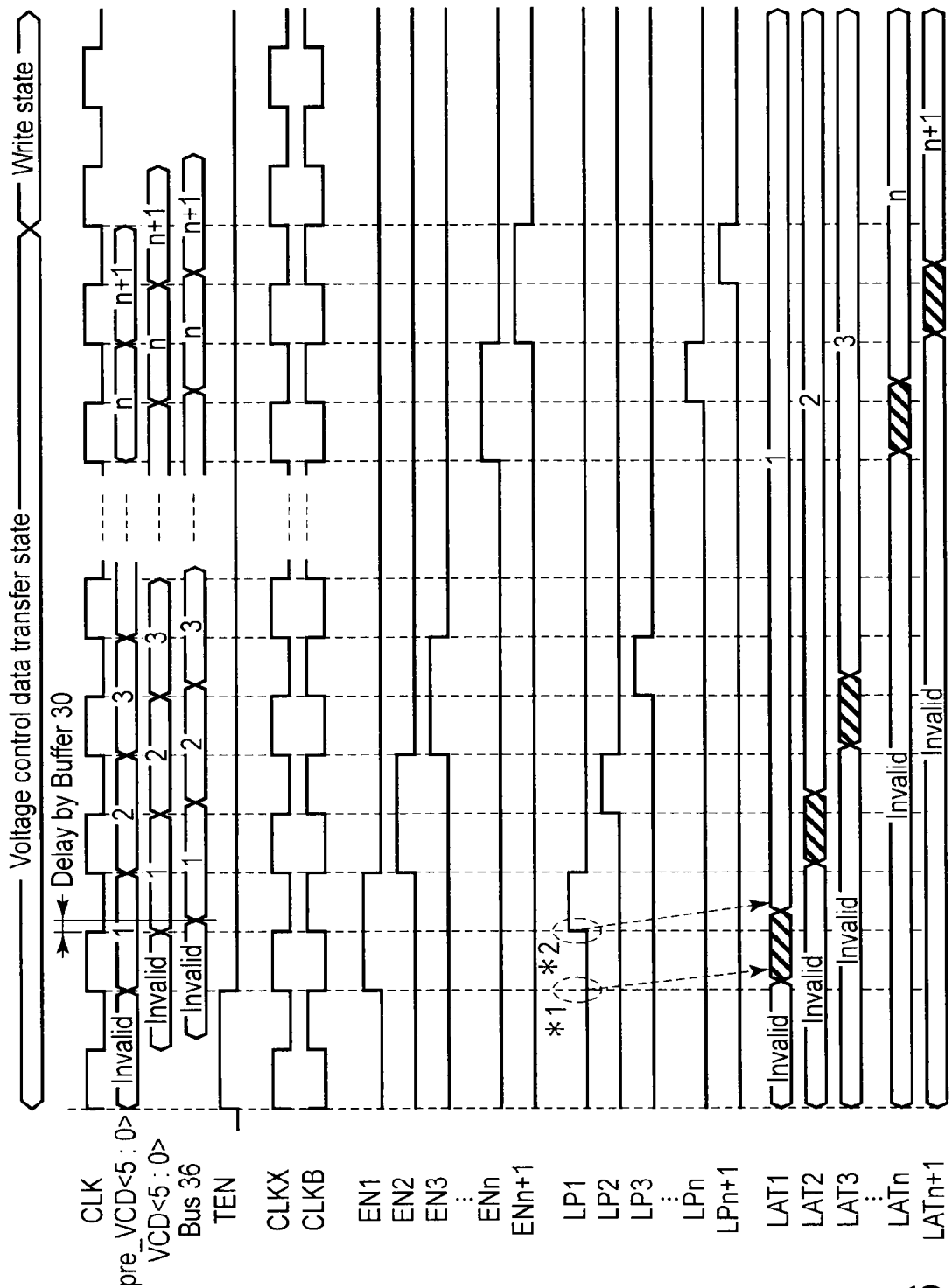
F I G. 6

SEMICONDUCTOR MEMORY DEVICE

CROSS-REFERENCE TO RELATED APPLICATIONS

This application is based upon and claims the benefit of priority from prior Japanese Patent Application No. 2010-281385, filed Dec. 17, 2010, the entire contents of which are incorporated herein by reference.

FIELD

Embodiments described herein relate generally to a semiconductor memory device.

BACKGROUND

As one type of nonvolatile semiconductor memory, a NAND flash memory is known. For example, when writing data to the NAND flash memory, various types of voltages are applied to word lines. That is, in case of a write operation, to prevent erroneous writing in non-selected cells and improve write characteristics, voltage different from that of a selected word line are applied to non-selected word lines adjacent to the selected word line, or voltages are applied to the word lines at timings that differ depending on the respective word lines. Further, voltages that differ depending on each of read, write, and erase operations are applied to the word lines. Therefore, there is required a control signal which specifies a type of voltage to be applied and timing at which the voltage is applied in accordance with each word line.

BRIEF DESCRIPTION OF THE DRAWINGS

FIG. 1 is a block diagram showing a configuration of a NAND flash memory 1 according to an embodiment;

FIG. 2 is a circuit diagram showing a configuration of a block BLK;

FIG. 3 is a circuit diagram showing a configuration of a voltage control data transfer unit 16;

FIG. 4 is a circuit diagram showing a configuration of a latch circuit LAT;

FIG. 5 is a circuit diagram showing a configuration of a flip-flop F/F;

FIG. 6 is a timing chart showing operations of the NAND flash memory 1;

DETAILED DESCRIPTION

Figure 7:
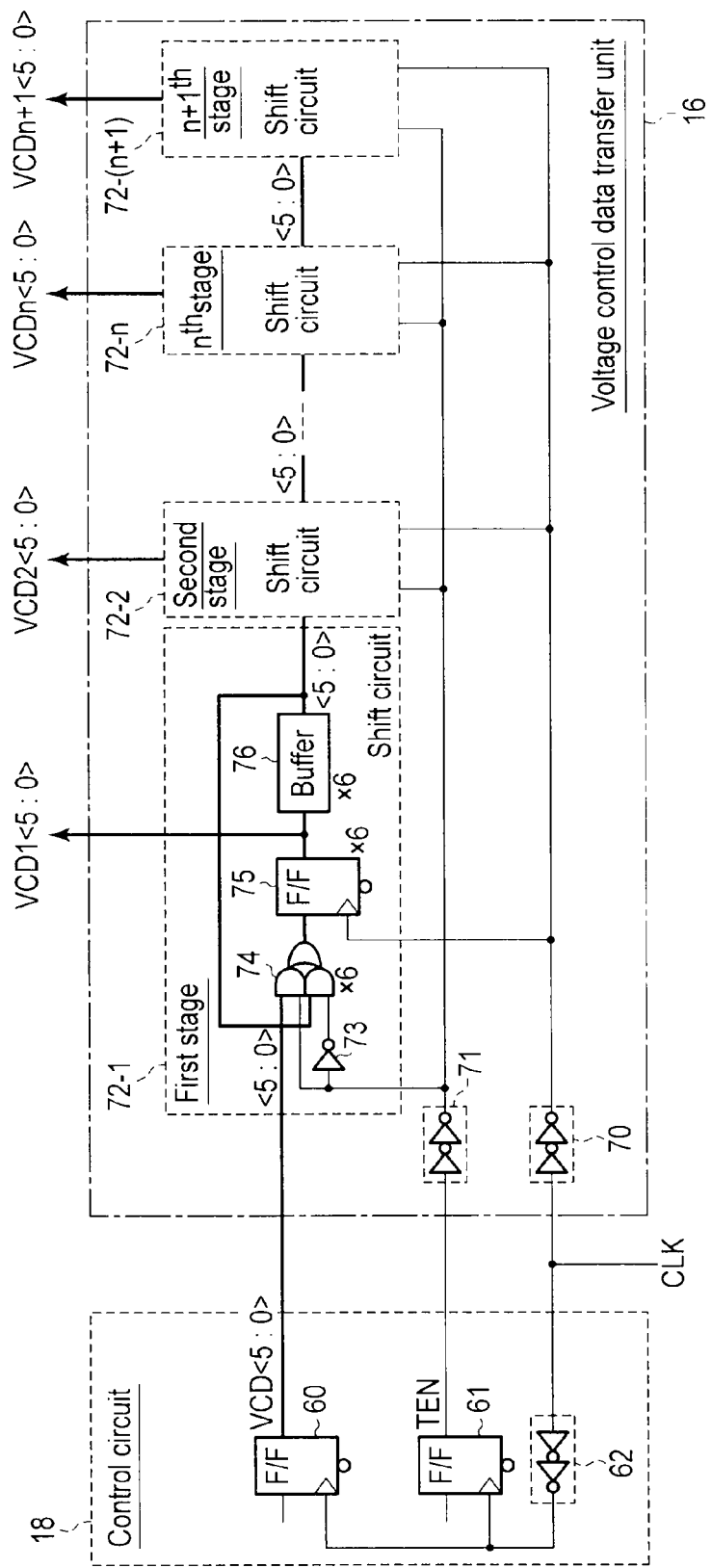
FIG. 7 is a circuit diagram showing a configuration of the voltage control data transfer unit 16 according to a comparative example.

In general, according to one embodiment, there is provided a semiconductor memory device comprising:
a memory cell array having memory cells;
word lines connected to the memory cell array;
a generation circuit configured to generate voltages required for operations of the memory cell array;
selection circuits connected to the word lines, respectively, each of the selection circuits being configured to select a voltage applied to a word line from the voltages; and
a transfer unit configured to transfer items of control data for selecting the voltage to the selection circuits, respectively, wherein the transfer unit includes transfer circuits which shift an enable signal in sequence, and
the transfer circuits include latch circuits which hold the items of control data based on the shifted enable signal, respectively.

The embodiments will be described hereinafter with reference to the accompanying drawings. In the description which follows, the same or functionally equivalent elements are denoted by the same reference numerals, to thereby simplify the description.

1. Overall Configuration of Nand Flash Memory

In the present embodiment, description will be given as to a NAND flash memory which is taken as an example of a semiconductor memory device. FIG. 1 is a block diagram showing a configuration of a NAND flash memory (a semiconductor memory device) 1 according to the embodiment.

The NAND flash memory 1 comprises a memory cell array 10. The memory cell array 10 comprises blocks BLK1 to BLKm each including memory cell transistors MT.

FIG. 2 is a circuit diagram showing a configuration of one block BLK included in the memory cell array 10. The block BLK comprises memory cell units CU. Each memory cell unit CU comprises memory cell transistors MT and two select transistors ST1 and ST2. The memory cell transistor MT includes a laminated gate structure which has a charge storage layer (e.g., a floating gate electrode) formed on a gate insulating film on a semiconductor substrate and a control gate electrode formed on an intergate insulating film on the charge storage layer. The memory cell transistor MT is not restricted to a floating gate structure, and it may have a metal-oxide-nitride-oxide-silicon (MONOS) structure using a system that traps electrons on an insulating film (e.g., a nitride film) as a charge storage layer.

Current paths of the memory cell transistors MT which are adjacent to each other in one memory cell unit are connected in series. A drain of the series-connected memory cell transistors MT on one end side is connected to a source of select transistor ST1, and a source of the series-connected memory cell transistors MT on the other end side is connected to a drain of select transistor ST2.

Respective control gate electrodes of the memory cell transistors MT provided in the same row are connected to one of word lines WL1 to WLn in common. Respective gate electrodes of select transistors ST1 and ST2 in the same row are connected to select gate lines SGD and SGS in common. A drain of each select transistor ST1 is connected to one of bit lines BL1 to BLi. Sources of select transistors ST2 provided in the same raw are connected to a source line CELSRC in common.

The memory cell transistors MT connected to the same word line WL constitute a page. Operations of writing and reading data are collectively carried out with respect to the memory cell transistors MT in one page. Further, the memory cell array 10 is constituted so that data for pages can be collectively erased, and a unit of the erase operation is the block BLK.

The bit line BL connects drains of the select transistors ST in common among blocks. That is, the memory cell units CU provided in the same column in the blocks are connected to the same bit line BL. Bit lines BL1 to BLi are connected to a sense amplifier (not shown) that controls voltages in bit lines BL1 to BLi and reads data from bit lines BL1 to BLi, a data latch (not shown) that temporarily stores data at the time of read and write operations, and others.

Each memory cell transistor MT can store data of one bit in accordance with, e.g., a change in threshold voltage due to a quantity of electrons injected in the floating gate electrode. The threshold voltage may be controlled more finely to store data of two or more bits in each memory cell transistor MT.

In FIG. 1, the NAND flash memory 1 comprises block decoders 11-1 to 11-$m$, a voltage generation circuit 12, voltage supply circuits 13-1 to 13-($n$+1), a voltage control data transfer unit 16, and a control circuit 18.

One block decoder 11 is connected to one block BLK through word lines WL1 to WLn. Block decoders 11-1 to 11-$m$ select a block including a select word line which is a write operation target or a read operation target or a block which is an erase operation target. Select operations of block decoders 11-1 to 11-$m$ are carried out based on an instruction from the control circuit 18.

The voltage generation circuit 12 generates various types of voltages. Different voltages are applied to the word lines of the NAND flash memory in accordance with the write, read, and erase operations. Further, in case of the write and read operations, different voltages are applied to a selected word line and a non-selected word line. In case of the erase operation, ground voltage (0 V) is applied to all of the word lines in the block BLK. Furthermore, in case of the write operation, for example, to avoid erroneous writing in the non-selected cells and improve write characteristics, different voltages are applied to, e.g., word lines WLn-1, WLn-2, and WLn-3 adjacent to the selected word line WLn, or voltages are applied to the respective word lines at different timings. To realize such operations of the NAND flash memory, the voltage generation circuit 12 generates all voltages required for the operation modes. In the embodiment, as various types of voltages generated by the voltage generation circuit 12, a voltage A to a voltage E, a write voltage, and a read voltage are exemplified in the drawing.

The n voltage supply circuits 13-1 to 13-$n$ apply some of the various types of voltages generated by the voltage generation circuit 12 to word lines WL1 to WLn through the block decoders 11. Voltage supply circuit 13-($n$+1) supplies a voltage, which is applied to a selected word line as a write target or a read target, to voltage supply circuits 13-1 to 13-$n$. Voltage supply circuits 13-1 to 13-($n$+1) comprise decoders 14-1 to 14-($n$+1) and voltage selection circuits 15-1 to 15-($n$+1), respectively.

Voltage selection circuits 15-1 to 15-$n$ receive voltage A to voltage E from the voltage generation circuit 12 and also receive a selected word line voltage from voltage supply circuit 13-($n$+1). Voltage selection circuits 15-1 to 15-$n$ supply voltages (a WL1 voltage to a WLn voltage), which are applied to word lines WL1 to WLn, to the respective block decoders 11 at predetermined timings based on decoding signals DS1 to DSn fed from decoders 14-1 to 14-$n$.

Voltage selection circuit 15-($n$+1) receives the write voltage and the read voltage from the voltage generation circuit 12. Voltage selection circuit 15-($n$+1) outputs one of the write voltage and the read voltage as a selected word line voltage based on a decoding signal DSn+1 supplied from decoder 14-($n$+1).

The respective decoders 14-1 to 14-$n$ receive a timing control signal TCNT supplied from the control circuit 18 and items of voltage control data VCD1 to VCDn supplied from the voltage control data transfer unit 16. The timing control signal TCNT is a signal indicative of timing for applying a voltage to a word line. Items of voltage control data VCD1 to VCDn are items of data used for determining a selected word line or a non-selected word line and determining a type of voltage that is applied to a non-selected word line. Decoders 14-1 to 14$n$ output decoding signals DS1 to DSn indicative of a type of voltage to be applied to a word line and timing for applying a voltage to a word line, based on the timing control signal TCNT and items of voltage control data VCD1 to VCDn.

Decoder 14-($n$+1) receives the timing control signal TCNT supplied from the control circuit 18 and voltage control data VCDn+1 supplied from the voltage control data transfer unit 16. Voltage control data VCDn+1 is data used for determining the write voltage or the read voltage. Decoder 14-($n$+1) outputs a decoding signal DSn+1 indicating one of the write voltage and the read voltage selected as the selected word line voltage, based on the timing control signal TCNT and voltage control data VCDn+1.

The voltage control data transfer unit 16 receives a clock CLK and also receives voltage control data VCD and a transfer enable signal TEN from the control circuit 18. The voltage control data VCD is obtained by serially outputting items of voltage control data VCD1 to VCDn+1. The transfer enable signal TEN is a signal indicative of start of output of the voltage control data VCD, and it is activated immediately before outputting the effective voltage control data VCD. The voltage control data transfer unit 16 comprises transfer circuits 17-1 to 17-($n$+1).

Transfer circuits 17-1 to 17-($n$+1) shift the transfer enable signal TEN and take in the voltage control data VCD when the shifted enable signal is activated. Moreover, transfer circuits 17-1 to 17-($n$+1) simultaneously output items of voltage control data VCD1 to VCDn+1 in, e.g., a write state, respectively.

The control circuit 18 controls operations of the entire NAND flash memory 1. The control circuit 18 generates various kinds of control signals for controlling the write operation, the read operation, and the erase operation of the NAND flash memory 1 and sends these control signals to predetermined circuits in the NAND flash memory 1.

[1-1. Configuration of Voltage Control Data Transfer Unit 16]

A specific configuration of the voltage control data transfer unit 16 will now be described. FIG. 3 is a circuit diagram showing a configuration of the voltage control data transfer unit 16. It is to be noted that FIG. 3 also shows some of circuits in the control circuit 18.

The control circuit 18 comprises flip-flops (F/F) 20 and 21 for 6 bits, a flip-flop 22 for one bit, and buffers 23 and 24. The control circuit 18 receives clock CLK. Clock CLK is generated in the NAND flash memory 1, for example.

Clock CLK is input to clock terminals of flip-flops 20 to 22. An output terminal of flip-flop 20 is connected to an input terminal of flip-flop 21. Flip-flop 20 outputs voltage control data pre_VCD<5:0>. An output terminal of flip-flop 21 is connected to the voltage control data transfer unit 16. Flip-flop 21 outputs voltage control data VCD<5:0>. An output terminal of flip-flop 22 is connected to the voltage control data transfer unit 16 through buffer 24. Flip-flop 22 outputs the transfer enable signal TEN through buffer 24. Flip-flops 20 to 22 are reset by a reset signal (not shown) that is input to reset terminals (circles on the lower sides of the flip-flops illustrated in FIG. 3) of flip-flops 20 to 22.

The voltage control data transfer unit 16 comprises transfer circuits 17-1 to 17-($n$+1), a buffer 30 for 6 bits, a buffer 31, and an inverter circuit 32. Buffer 30 receives voltage control data VCD<5:0> from the control circuit 18 and has an output terminal connected to a data bus 36 having a six-bit width.

Clock CLK is input to an input terminal of buffer 31, and buffer 31 outputs a clock CLKX. Clock CLKX is input to an input terminal of the inverter circuit 32, and the inverter circuit 32 outputs an inverted clock CLKB obtained by inverting clock CLKX.

Each transfer circuit 17 comprises a flip-flop 33 for one bit, an AND gate 34, a buffer 35 for one bit, and a latch circuit LAT for 6 bits. The transfer enable signal TEN is input to an input terminal of flip-flop 33-1 on the first stage from the control circuit 18. An output terminal of flip-flop 33-1 is connected to an input terminal of flip-flop 33-2 on the second stage through buffer 35-1. Clock CLKX is input to a clock terminal of flip-flop 33-1.

Flip-flop 33-1 outputs the transfer enable signal TEN on the rising edge of clock CLKX and holds the data until the rising edge of the next clock CLKX. Further, flip-flop 33-1 outputs an enable signal EN1. Enable signal EN1 is input to the input terminal of flip-flop 33-2 through buffer 35-1. Flip-flop 33-2 holds an output from buffer 35-1 in synchronization with the rising edge of clock CLKX and outputs an enable signal EN2. A configuration of each of flip-flops 33-3 to 33-($n$+1) on subsequent stages of flip-flop 33-2 is the same as that of flip-flop 33-2. Therefore, flip-flops 33-1 to 33-($n$+1) operate to shift the transfer enable signal TEN. Flip-flops 33-1 to 33-($n$+1) are reset by a reset signal (not shown) input to reset terminals (circles on the lower sides of the flip-flops) thereof.

Enable signal EN1 from flip-flop 33-1 is input to a first input terminal of AND gate 34-1, and inverted clock CLKB is input to a second input terminal of AND gate 34-1. AND gate 34-1 outputs a latch pulse LP1. An output terminal of AND gate 34-1 is connected to a clock terminal of latch circuit LAT1.

An input terminal of latch circuit LAT1 is connected to a data bus 36. Latch circuit LAT1 outputs data of the data bus 36 during a period that a latch pulse LP1 is high and holds the data during a period that latch pulse LP1 is low. Furthermore, latch circuit LAT1 outputs voltage control data VCD1<5:0>. A configuration of each of latch circuits LAT2 to LATn+1 is the same as that of latch circuit LAT1. Latch circuits LAT1 to LATn+1 are reset by a reset signal (not shown) input to reset terminals (circles on the lower sides of the latch).

FIG. 4 is a circuit diagram showing a configuration of the latch circuit LAT used in the voltage control data transfer unit 16. The latch circuit LAT comprises clocked inverter circuits 40 and 41, inverter circuits 42 to 45, and a NOR gate 46.

A clock CK and an inverted clock CKB obtained by inverting clock CK by the inverter circuit 45 are input to control terminals of clocked inverter circuits 40 and 41. Clocked inverter circuit 40 operates when clock CK is high, and clocked inverter circuit 41 operates when inverted clock CKB is high. The latch circuit LAT is reset (output Q=0) when a reset signal CD is low. The latch circuit LAT outputs a D input to Q during a period that clock CK is high and holds the data during a period that clock CK is low.

FIG. 5 is a circuit diagram showing a configuration of the flip-flop F/F used in the voltage control data transfer unit 16. The flip-flop F/F comprises clocked inverter circuits 50 to 53, inverter circuits 54 to 57, and NOR gates 58 and 59.

Clock CK and inverted clock CKB obtained by inverting clock CK by the inverter circuit 57 are input to control terminals of clocked inverter circuits 50 to 53. Clocked inverter circuits 50 and 53 operate when inverted clock CKB is high, and clocked inverter circuits 51 and 52 operate when clock CK is high. The flip-flop F/F is reset (output Q=0) when the reset signal CD is low. The flip-flop F/F outputs a D input to Q on the rising edge of clock CK and holds the data until the rising edge of the next clock. A portion surrounded by a broken line in FIG. 5 in circuits constituting the flip-flop F/F is a circuit additionally provided to the latch circuit LAT. The flip-flop F/F has a larger circuit area than that of the latch circuit LAT.

2. Operations

Operations of the thus configured NAND flash memory 1 will now be described. FIG. 6 is a timing chart showing operations of the NAND flash memory 1.

Flip-flop 20 in the control circuit 18 outputs the control voltage data pre_VCD<5:0> in synchronization with the rising edge of clock CLK. Flip-flop 21 outputs voltage control data pre_VCD<5:0> on the falling edge of clock CLK and holds the data until the falling edge of the next clock CLK. Based on the operation, flip-flop 21 outputs voltage control data VCD<5:0>.

Voltage control data VCD<5:0> is data obtained by serially connecting items of voltage control data VCD1 to VCDn+1 in the mentioned order. Voltage control data VCD<5:0> is sent to the data bus 36 of the voltage control data transfer unit 16 through buffer 30. Numbers 1 to (n+1) in FIG. 6 represent items of voltage control data VCD1 to VCDn+1, respectively.

Flip-flop 22 in the control circuit 18 outputs the transfer enable signal TEN through buffer 24 in synchronization with the rising edge of clock CLK. The transfer enable signal TEN is constituted of a pulse having a one-cycle width that goes high immediately before first effective data is output as voltage control data pre_VCD<5:0>.

Flip-flops 33-1 to 33-($n$+1) in the voltage control data transfer unit 16 shift the transfer enable signal TEN in synchronization with clock CLKX that have the same phase as that of clock CLK. Buffer 35-1 connected to the output of flip-flop 33-1 is interposed to ensure hold timing with respect to flip-flop 33-2 on the subsequent stage. The configuration is also applied to the other buffers 35-2 to 35-($n$+1).

AND gates 34-1 to 34-($n$+1) perform an AND operation of enable signals EN1 to ENn+1 generated by shifting the transfer enable signal TEN and inverted clock CLKB to generate latch pulses LP1 to LPn+1, respectively.

Latch circuits LAT1 to LATn+1 output voltage control data VCD<5:0> of the data bus 36 during the high period of latch pulses LP1 to LPn+1 and holds the data during the low period of latch pulses LP1 to LPn+1, respectively. As a result, as shown in FIG. 6, latch circuits LAT1 to LATn+1 output items of voltage control data VCD1 to VCDn+1 and hold these items of data, respectively. It is to be noted that buffer 30 is interposed between the control circuit 18 and the data bus 36 for the purpose of ensuring setup timing for the falling edge of the latch pulse. Buffers 30 and 35 are constituted by, e.g., connecting a predetermined number of inverter circuits in series.

The voltage control data transfer state is terminated at the instant of holding items of voltage control data VCD1 to VCDn+1 by all latch circuits LAT1 to LATn+1, respectively. Then, the NAND flash memory change to, e.g., a write state. In the write state, predetermined voltages are applied to the word lines at predetermined timings based on items of voltage control data VCD1 to VCDn+1 supplied from transfer circuits 17-1 to 17-($n$+1) to voltage supply circuits 13-1 to 13-($n$+1), thereby writing data to the memory cell array 10.

As indicated by *1 in FIG. 6, when inverted clock CLKB and the enable signal EN are subjected to the AND operation, noise may be possibly induced in the latch pulse LP, and the latch circuit LAT may possibly take in unexpected data (each shaded portion in FIG. 6) because of the noise. Furthermore, the latch circuit LAT may possibly take in unexpected data at timing *2 in FIG. 6.

However, in the NAND flash memory 1, the latch circuit LAT uses the held data at timing after transfer of the voltage control data is all terminated and the control circuit 18 changes to the write state. Therefore, if the latch circuit LAT can hold expected data at the timing of the falling edge of the latch pulse LP, there occurs no problem in operations even though unexpected data is temporarily held in the latch circuit in midstream. This phenomenon may possibly occur in not only the latch circuit in the first stage but also all of the latch circuits, but there is no problem.

3. Comparative Example

A comparative example will now be described. FIG. 7 is a circuit diagram showing a configuration of a voltage control data transfer unit 16 according to the comparative example. It is to be noted that FIG. 7 also shows some of circuits in a control circuit 18.

The control circuit 18 comprises a flip-flop 60 for 6 bits, a flip-flop for one bit, and a buffer 62. The control circuit 18 receives a clock CLK. The clock CLK is input to clock terminals of flip-flops 60 and 61 through buffer 62.

An output terminal of flip-flop 60 is connected to the voltage control data transfer unit 16. Flip-flop 60 outputs voltage control data VCD<5:0>. An output terminal of flip-flop 61 is connected to the voltage control data transfer unit 16. Flip-flop 61 outputs a transfer enable signal TEN.

The voltage control data transfer unit 16 comprises buffers 70 and 71 and shift circuits 72-1 to 72-(n+1). Shift circuit 72-1 comprises an inverter circuit 73, a selector 74 for 6 bits, a flip-flop 75 for 6 bits, and a buffer 76 for 6 bits.

Voltage control data VCD<5:0> is input to a first input terminal of the selector 74. The transfer enable signal TEN is connected to a control terminal of the selector 74 through buffer 71 and the inverter circuit 73. An output terminal of the selector 74 is connected to an input terminal of flip-flop 75. Flip-flop 75 operates in synchronization with the rising edge of clock CLK and outputs voltage control data VCD1. An output terminal of flip-flop 75 is connected to shift circuit 72-2 on the second stage through buffer 76. An output terminal of buffer 76 is connected to a second input terminal of the selector 74. Buffer 76 is interposed to ensure holding timing with respect to the flip-flop on the subsequent stage. A configuration of each of shift circuits 72-2 to 72-(n+1) is the same as that of shift circuit 72-1.

Figure 8:
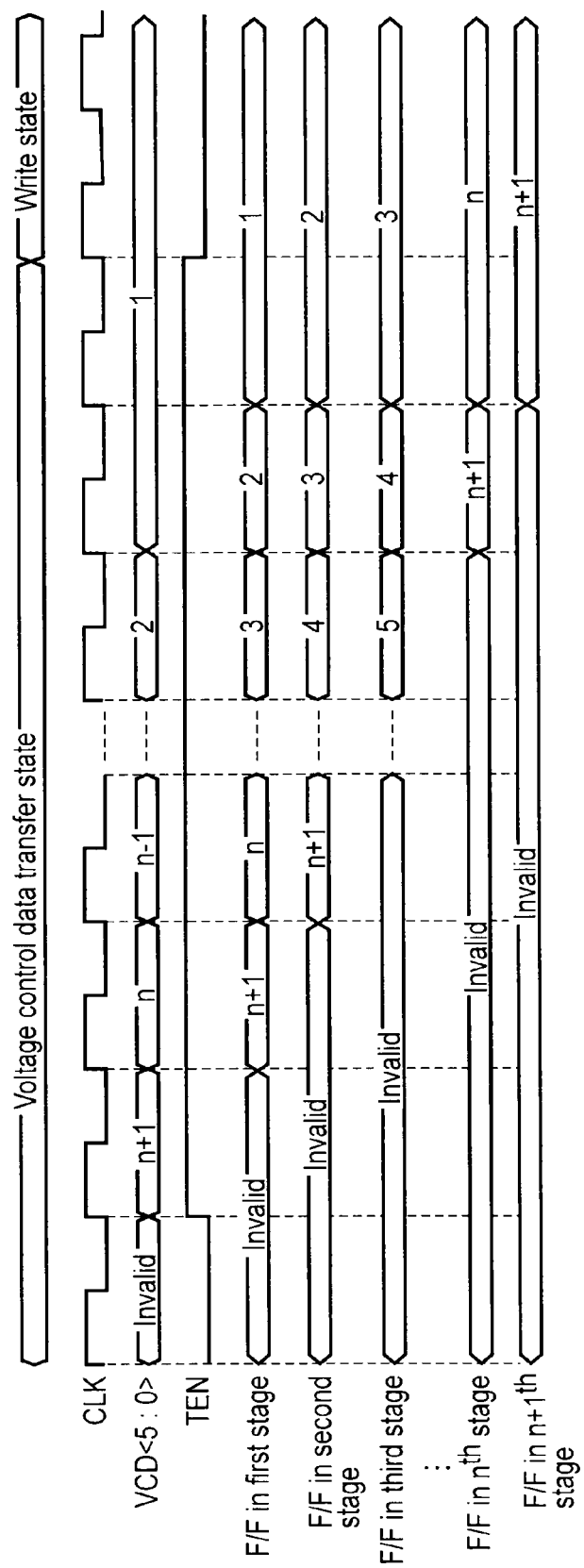
FIG. 8 is a timing chart showing operations of the voltage control data transfer unit 16 according to the comparative example.

FIG. 8 is a timing chart showing operations of the voltage control data transfer unit 16 according to the comparative example. Shift circuits 72-1 to 72-(n+1) sequentially shift voltage control data VCD<5:0> during a period that the transfer enable signal TEN is high. Moreover, shift circuits 72-1 to 72-(n+1) hold data when the transfer enable signal TEN is low.

In case that the voltage control data transfer unit according to the comparative example is a data shift circuit using the flip-flops and the NAND flash memory is constituted by using the voltage control transfer unit according to the comparative example, for example, when n=34, a total of 35 shift circuits are required. When the voltage control data consists of 6 bits, 210 flip-flops, 210 buffers for ensuring hold times of items of shift data, and 210 selectors (AND-OR gates) intended to hold data after end of transfer are required. The 210 flip-flops have a large area as control logics in the memory chip, and size reduction must be examined.

4. Effects

As described above, according to the present embodiment, the NAND flash memory 1 comprises the voltage supply circuits 13 configured to supply voltages to the word lines WL and also comprises the voltage control data transfer unit 16 configured to transfer to the voltage supply circuits 13 the items of voltage control data VCD for controlling voltage selecting operations of the voltage supply circuits 13. The voltage control data transfer unit 16 comprises the transfer circuits 17 that hold and output the items of voltage control data VCD supplied from the control circuit 18. Further, the transfer circuits 17 shift the transfer enable signal supplied from the control circuit 18 and hold associated one of the items of voltage control data VCD by using the latch circuit based on the shifted transfer enable signal.

Therefore, according to the embodiment, the items of voltage control data can be transferred from the control circuit 18 to the voltage control data transfer unit 16 in a serial manner. For example, when transferring the items of voltage control data from the control circuit 18 to the voltage control data transfer unit 16 in parallel, many interconnect lines are required, thereby increasing an interconnect area. However, in the embodiment, since the number of interconnect lines can be reduced, an interconnect area can be decreased.

Additionally, an area of the voltage control data transfer unit 16 that transfers the items of voltage control data VCD can be reduced. As a result, an area of the NAND flash memory 1 can be decreased. Specifically, as can be understood from FIG. 4 and FIG. 5, an area of the latch circuit is substantially half that of the flip-flop. Therefore, when using the latch circuit to configure the voltage control data transfer unit 16, the effect for reducing a chip area is considerable.

Further, since the circuit that holds voltage control data VCD is changed from the flip-flop to the latch circuit, peripheral circuits that are required when using the flip-flop can be reduced. As a result, the area of the NAND flash memory 1 can be further reduced.

In the embodiment, for example, when n=34 is set, the 210 flip-flops can be constituted of the latch circuits as compared with the comparative example. Furthermore, the 210 buffers for ensuring hold times and the 210 selectors (AND-OR gates) can be reduced. On the other hand, as compared with the comparative example, although circuits that must be added are shift flip-flops equal in number to the stages, buffers that ensure the hold times and are equal in number to the stages, and AND gates equal in number to the stages, it can be said that the addition of these circuits is a small increase as compared with the above-described reducing effect.

Moreover, the area reducing effect according to the embodiment is enhanced as the number of the word lines is increased. Likewise, although the bit width of voltage control data VCD<5:0> is enlarged as the number of types of voltages applied to the word lines is increased, using the voltage control data transfer unit according to the embodiment enables reducing the interconnect area even in such a case.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array having memory cells;
word lines connected to the memory cell array;

a generation circuit configured to generate voltages required for operations of the memory cell array;

selection circuits connected to the word lines, respectively, each of the selection circuits being configured to select a voltage applied to a word line from the voltages; and a transfer unit configured to transfer items of control data for selecting the voltage to the selection circuits, respectively, wherein the transfer unit includes transfer circuits which shift an enable signal in sequence, and the transfer circuits include latch circuits which hold the items of control data based on the shifted enable signal, respectively.

2. The device of claim 1, wherein the transfer circuits include flip-flops which hold the shifted enable signal, respectively.

3. The device of claim 2, wherein the flip-flops are serially connected.

4. The device of claim 2, wherein each of the transfer circuits includes a buffer connected to an output of the flip-flop.

5. The device of claim 4, wherein an output of the buffer is input to a next flip-flop.

6. The device of claim 1, wherein each of the transfer circuits includes an AND gate which performs an AND operation of the shifted enable signal and a clock and outputs a latch pulse, and each of the latch circuits operates based on the latch pulse.

7. The device of claim 1, further comprising a data bus through which the items of control data are transferred, wherein the data bus is connected to the latch circuits.

8. The device of claim 1, further comprising a control circuit configured to supply the enable signal and the items of control data to the transfer unit.

9. The device of claim 8, wherein the control circuit serially outputs the items of control data.

10. The device of claim 9, further comprising a buffer configured to receive the items of control data output from the control circuit.

11. The device of claim 1, wherein the latch circuits hold the items of control data in a first state, and simultaneously output the items of data in a second state.

12. The device of claim 1, further comprising decoders connected between the transfer circuits and the selection circuits, respectively.

13. The device of claim 12, further comprising a control circuit connected to the transfer unit and the decoders, and configured to supply the enable signal and the items of control data to the transfer unit and to supply a control signal to the decoders.

14. The device of claim 1, wherein the generation circuit is connected to the selection circuits.

15. The device of claim 1, wherein the memory cell array is a NAND flash memory.

\* \* \* \* \*